(12) United States Patent
Cho et al.

(10) Patent No.: US 11,462,422 B2
(45) Date of Patent: Oct. 4, 2022

(54) APPARATUS HAVING COOLING LINE FOR COLLECTING BY-PRODUCT IN SEMICONDUCTOR MANUFACTURING PROCESS

(71) Applicant: MILAEBO CO., LTD., Pyeongtaek-si (KR)

(72) Inventors: Che Hoo Cho, Seongnam-si (KR); Yeon Ju Lee, Osan-si (KR); Myung Pil Han, Yongin-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 574 days.

(21) Appl. No.: 16/668,205

(22) Filed: Oct. 30, 2019

(65) Prior Publication Data
US 2021/0134621 A1     May 6, 2021

(51) Int. Cl.
| | |
|---|---|
| *B29C 65/00* | (2006.01) |
| *H01L 21/67* | (2006.01) |
| *C23C 16/44* | (2006.01) |
| *B01D 45/16* | (2006.01) |
| *B01D 53/00* | (2006.01) |

(52) U.S. Cl.
CPC .... *H01L 21/67017* (2013.01); *C23C 16/4412* (2013.01); *B01D 45/16* (2013.01); *B01D 53/002* (2013.01); *B01D 2258/0216* (2013.01)

(58) Field of Classification Search
CPC .......... H01L 21/67017; C23C 16/4412; B01D 45/16; B01D 53/002; B01D 2258/0216
See application file for complete search history.

(56) References Cited

U.S. PATENT DOCUMENTS

| | | | | |
|---|---|---|---|---|
| 5,820,641 | A * | 10/1998 | Gu ........................ | B01D 5/0006 55/DIG. 15 |
| 6,488,745 | B2 * | 12/2002 | Gu ........................ | B01D 53/002 55/DIG. 15 |
| 2007/0107595 | A1 * | 5/2007 | Na .......................... | B01D 53/68 95/288 |

(Continued)

FOREIGN PATENT DOCUMENTS

| | | |
|---|---|---|
| KR | 10-0717837 B1 | 5/2007 |
| KR | 100718692 B1 | 5/2007 |

(Continued)

*Primary Examiner* — Dung H Bui
(74) *Attorney, Agent, or Firm* — Rabin & Berdo, P.C.

(57) ABSTRACT

Disclosed is an apparatus having a cooling line for collecting a by-product in a semiconductor manufacturing process. The apparatus includes: a housing (110) including an inner wall plate (111) on an inner wall thereof to collect a by-product while generating a vortex in exhaust gas which is temperature-controlled by a heater (140) while being introduced through a gas inlet of an upper plate; an internal collecting tower (150) including vertical plates, an upper cover plate, and vortex plates fitted to the vertical plates, and condensing the introduced exhaust gas to collect the by-product; a main cooling channel (160) cooling the exhaust gas by using coolant while passing through the internal collecting tower (150); and a multi-connection pipe (170) sequentially supplying the coolant to an upper plate cooling channel and a main cooling channel and discharging the coolant, by using a supply pipe and a discharge pipe provided outside the housing.

6 Claims, 9 Drawing Sheets

(56) References Cited

U.S. PATENT DOCUMENTS

| | | | |
|---|---|---|---|
| 2009/0107091 A1* | 4/2009 | Cho | C23C 16/4412 |
| | | | 55/440 |
| 2009/0217634 A1* | 9/2009 | Choi | H01L 21/67017 |
| | | | 55/428.1 |
| 2019/0194804 A1* | 6/2019 | Cho | C23C 16/4412 |
| 2020/0164296 A1* | 5/2020 | Cho | H01L 21/67017 |
| 2020/0217559 A1* | 7/2020 | Hwang | F24H 3/00 |
| 2020/0321226 A1* | 10/2020 | Cho | B01D 51/02 |
| 2021/0134621 A1* | 5/2021 | Cho | C23C 16/4412 |
| 2021/0134701 A1* | 5/2021 | Cho | H01L 23/473 |

FOREIGN PATENT DOCUMENTS

| | | | | |
|---|---|---|---|---|
| KR | 10-0862684 B1 | | 10/2008 | |
| KR | 101117098 B1 | * | 3/2012 | ....... H01L 21/67017 |
| KR | 20130028239 A | * | 3/2013 | ....... H01L 21/67017 |
| KR | 101317626 B1 | | 10/2013 | |
| KR | 10-1447629 B1 | | 10/2014 | |
| KR | 101761725 B1 | | 8/2017 | |
| KR | 10-2017-0111437 A | | 10/2017 | |
| KR | 10-1806480 B1 | | 1/2018 | |
| KR | 20210010096 A | * | 1/2021 | ....... H01L 21/67017 |
| TW | 446111 U | | 7/2001 | |

* cited by examiner

APPARATUS HAVING COOLING LINE FOR COLLECTING BY-PRODUCT IN SEMICONDUCTOR MANUFACTURING PROCESS

BACKGROUND OF THE INVENTION

Field of the Invention

The present invention relates generally to an apparatus having a cooling line for collecting a by-product in a semiconductor manufacturing process. More particularly, the present invention relates to a collecting apparatus in which in order to efficiently collect a by-product contained in exhaust gas discharged after use in a process chamber for manufacturing a semiconductor, a cooling channel is directly introduced into an internal space of the apparatus, thus increasing efficiency of collecting the by-product by an internal collecting tower.

Description of the Related Art

Generally, a semiconductor manufacturing process is roughly classified into a fabrication process and an assembly process.

The fabrication process is a process for manufacturing semiconductor chips on which a predetermined pattern is formed by repeating a process in which a thin film is deposited on a wafer in various process chambers and the deposited thin film is selectively etched.

The assembly process is a process of individually cutting the chips manufactured on the wafer in the fabrication process, and then joining the cut chip with a lead frame to assemble into the finished product.

In detail, the fabrication process is a process of depositing a thin film on the wafer or etching a thin film deposited on the wafer. The process is performed under high-temperature conditions by supplying process gases such as silane ($SiH_4$), arsine, boron chloride, and hydrogen, and tungsten hexafluoride ($WF_6$) into a process chamber. During the process, a large amount of various ignitable gases and hazardous gases containing corrosive foreign substances and toxic components are produced inside the process chamber.

Therefore, in order to purify and discharge such hazardous gases, the semiconductor manufacturing equipment is provided with: a vacuum pump evacuating the process chamber; and a scrubber provided at a rear end of the vacuum pump to purify the exhaust gas discharged from the process chamber and to discharge the exhaust gas to the atmosphere.

However, the scrubber only treats and removes a by-product which is in a form of gas. Due to this, when the by-product is discharged externally from the process chamber and then solidified, the by-product may be adhered to an exhaust line, leading to increasing exhaust pressure. In addition, the by-product may be introduced into the vacuum pump and cause a failure of the vacuum pump and backflow of the hazardous gas into the process chamber, leading to contamination of the wafer.

In order to address such problems, the semiconductor manufacturing equipment is provided with an apparatus for collecting a by-product between the process chamber and the vacuum pump to condense exhaust gas discharged from the process chamber.

Such an apparatus for collecting a by-product in the related art is connected to the process chamber and the vacuum pump by a pumping line to condense and collect particulate by-products contained in the exhaust gas that results from reaction and is discharged from the process chamber.

The apparatus for collecting a by-product generally includes: a housing providing a space for accommodating introduced exhaust gas; an upper plate covering top of the housing, with a cooling channel for O-ring protection and maintaining an appropriate temperature for byproduct collection; an internal collecting tower condensing and collecting a by-product that is contained in exhaust gas introduced into the housing; and a heater controlling an appropriate temperature distribution in which the exhaust gas introduced into the housing can form the by-product.

The most important thing in the apparatus for collecting a by-product configured as described above is that exhaust gas comes into uniform contact with each surface of plates constituting the internal collecting tower provided inside the housing, allowing particulate toxic substances contained in the exhaust gas to be efficiently and quickly condensed and collected as a by-product.

However, in the apparatus for collecting a by-product in the related art, there is employed a method in which collection of by-products is performed while high-temperature exhaust gas, which is introduced into the housing and controlled to have an appropriate temperature distribution capable of by-product formation by the heater, comes into contact with the surfaces of plates of the internal collecting tower, or a method in which a propeller is used to change the flow of the introduced exhaust gas to spread uniformly inside the housing such that collection of by-products is performed while the exhaust gas comes into contact with the surfaces of the plates of the internal collecting tower. This causes a problem in that the temperature of an inner plate of the internal collecting tower is higher than that of an outer plate, leading to lowering condensation efficiency. Another problem is that the exhaust gas is not introduced efficiently and does not spread uniformly, and thus the amount of surface contact with the plates of the internal collecting tower is not large, leading to increasing the time the introduced exhaust gas is condensed as a by-product.

The foregoing is intended merely to aid in the understanding of the background of the present invention, and is not intended to mean that the present invention falls within the purview of the related art that is already known to those skilled in the art.

Documents of Related Art (Patent document 1) Korean Patent No. 10-0717837 (May 7, 2007)

(Patent document 2) Korean Patent No. 10-0862684 (Oct. 2, 2008)

(Patent document 3) Korean Patent No. 10-1447629 (Sep. 29, 2014)

(Patent document 4) Korean Patent No. 10-1806480 (Dec. 1, 2017)

SUMMARY OF THE INVENTION

Accordingly, the present invention has been made keeping in mind the above problems occurring in the related art, and an objective of the present invention is to provide an apparatus for collecting a by-product, the apparatus including a main cooling channel passing through an internal collecting tower, an inner wall plate provided on an inner wall of a housing, and the internal collecting tower having gas holes of different sizes and assembled plates, whereby a vortex is generated while introduced exhaust gas is cooled, allowing a by-product condensed at high density to be collected.

In order to achieve the above objective, according to one aspect of the present invention, there is provided an apparatus having a cooling line for collecting a by-product in a semiconductor manufacturing process, the apparatus being provided on a line between a process chamber and a vacuum pump to collect a by-product in exhaust gas, which is discharged from the process chamber, the apparatus including:

a housing in which the exhaust gas introduced through an upper plate having a gas inlet and an upper plate cooling channel is accommodated and then the exhaust gas is discharged through a lower plate having a gas outlet, and including an inner wall plate on an inner wall thereof to collect the by-product while generating a vortex in the exhaust gas which is temperature-controlled by a heater while being introduced through the gas inlet of the upper plate;

an internal collecting tower provided inside the housing at a location spaced apart upward from the lower plate by a predetermined distance, and including multiple vertical plates providing a main cooling channel installation space, an upper cover plate covering upper sides of the vertical plates to induce flow of the exhaust gas, and vortex plates fitted to the vertical plates to generate a vortex in which the vertical plates, the upper cover plate, and the vortex plates are assembled together, the internal collecting tower condensing the introduced exhaust gas to collect the by-product;

a main cooling channel cooling the exhaust gas by using coolant while passing through the internal collecting tower; and a multi-connection pipe sequentially supplying the coolant to the upper plate cooling channel and the main cooling channel in a circulative manner and discharging the coolant, by using a supply pipe and a discharge pipe that are provided outside the housing.

In a preferred embodiment, the inner wall plate may be provided as multiple inner wall plates that are arranged on each side of the inner wall of the housing at a regular interval over upper and lower regions, the inner wall plates on each side of the housing may be arranged alternately with the inner wall plates on a neighboring side, and the inner wall plates on each side of the housing may be arranged alternately at upper and lower locations such that each of the inner wall plates is shorter in length than a horizontal length of each side of the housing.

In a preferred embodiment, the upper plate cooling channel of the upper plate may be configured such that the coolant supplied externally is introduced through a first branch socket connected to a coolant inlet of the multi-connection pipe and circulates, and then the coolant is discharged to the multi-connection pipe through a second branch socket to be supplied to the main cooling channel.

In a preferred embodiment, the internal collecting tower may include the multiple vertical plates arranged spaced apart from each other at a regular interval, the upper cover plate covering the upper sides of the vertical plates, and a base plate supporting lower portions of the vertical plates, and the vortex plates fitted to cross the vertical plates in horizontal directions, wherein gas holes may be respectively formed in surfaces of each of the vertical plates, the upper cover plate, the base plate, and each of the vortex plates, and each of the vertical plates may include at least one pipe slit formed vertically to allow the main cooling channel to pass through the vertical plates, such that the main cooling channel having a U-shaped pipe shape may be installed while easily adjusting a vertical position thereof.

In a preferred embodiment, a part of the vortex plates may be provided at each of opposite vertical plates of the internal collecting tower so as to protrude outward, such that the flow of the exhaust gas may be retarded while generating the vortex.

In a preferred embodiment, the upper cover plate may include multiple gas holes of different sizes formed in a surface thereof, wherein a part of the gas holes that is located at opposite end portions in long side directions of the upper cover plate may be larger in size than a remaining part of the gas holes that is located at other locations, such that the exhaust gas introduced from above the upper cover plate may be more discharged through the end portions thereof than central portions.

In a preferred embodiment, the gas hole of each of the vertical plates may be larger in size than the gas hole of each of the vortex plates.

In a preferred embodiment, the main cooling channel may have a U-shaped pipe shape, with horizontal pipes located at upper and lower locations, and a curved pipe connecting the horizontal pipes to each other at a side of the main cooling channel.

In a preferred embodiment, the main cooling channel may be provided as two or more main cooling channels.

In a preferred embodiment, in the multi-connection pipe, the coolant may be introduced through a first branch socket of the upper plate cooling channel connected to a coolant inlet and circulate, the coolant may be discharged to the supply pipe through a second branch socket and supplied to the main cooling channel through a branch socket located below the supply pipe, the coolant introduced into lower horizontal pipes of the main cooling channels may be moved to upper horizontal pipes to cool the exhaust gas around the internal collecting tower and discharged to the discharge pipe, and the coolant may be discharged through a coolant outlet located at an end of the discharge pipe.

In a preferred embodiment, when two or more main cooling channels are provided, the multi-connection pipe may include a coolant chamber located at each of lower and upper locations in which the supply pipe and the discharge pipe are located, each of the respective coolant chambers having an internal space, such that one supply pipe simultaneously may supply the coolant collected in the internal space of the coolant chamber located at the lower location to two or more supply pipes located at lower locations, or heat-exchanged coolant discharged to the internal space of the coolant chamber located at the upper location may be discharged through one discharge pipe.

In a preferred embodiment, the heater may further include a heat distribution plate provided at a lower portion thereof by a fastening means so as to be spaced apart downward by a predetermined distance, the heat distribution plate having multiple gas holes formed in end portions thereof such that a part of the exhaust gas is supplied toward top of the internal collecting tower located below the heat distribution plate, and a remaining part of the exhaust gas is supplied toward the inner wall of the housing located sideward of the heat distribution plate.

The apparatus for collecting a by-product according to the present invention having the above characteristics has an advantage in that due to provision of the main cooling channel passing through the internal collecting tower, exhaust gas, which is temperature-controlled by the heater while being introduced into the housing, is cooled to an optimum temperature for collecting a by-product, thus collecting a by-product condensed at high density on the internal collecting tower.

The present invention has another advantage in that due to the assembly structure between the vertical plates, the upper cover plate, and the vortex plates constituting the internal collecting tower, and due to the structure of the gas holes of different sizes formed in the surfaces of the plates, introduced exhaust gas generates a vortex and thus is spread uniformly due to increased time the exhaust gas passing through the internal collecting tower stays therein, thus collecting a by-product condensed at high density from the exhaust gas.

The present invention is a useful invention having various advantages as described above and is expected to find wide application in industry.

BRIEF DESCRIPTION OF THE DRAWINGS

The above and other objectives, features, and other advantages of the present invention will be more clearly understood from the following detailed description when taken in conjunction with the accompanying drawings, in which.

DETAILED DESCRIPTION OF THE INVENTION

Hereinafter, the configuration and the operation of exemplary embodiments of the present invention will be described in detail with reference to the accompanying drawings.

In the following description, it is to be noted that, when the functions of conventional elements and the detailed description of elements related with the present invention may make the gist of the present invention unclear, a detailed description of those elements will be omitted.

Figure 1:
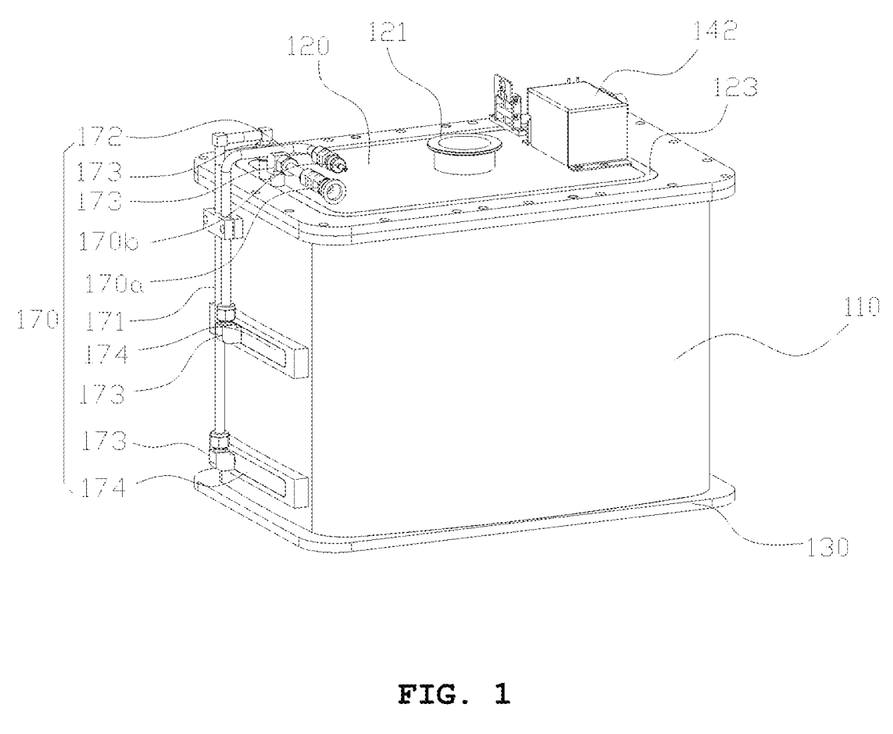
FIG. 1 is a perspective view showing an apparatus for collecting a by-product according to one embodiment of the present invention.
Figure 2:
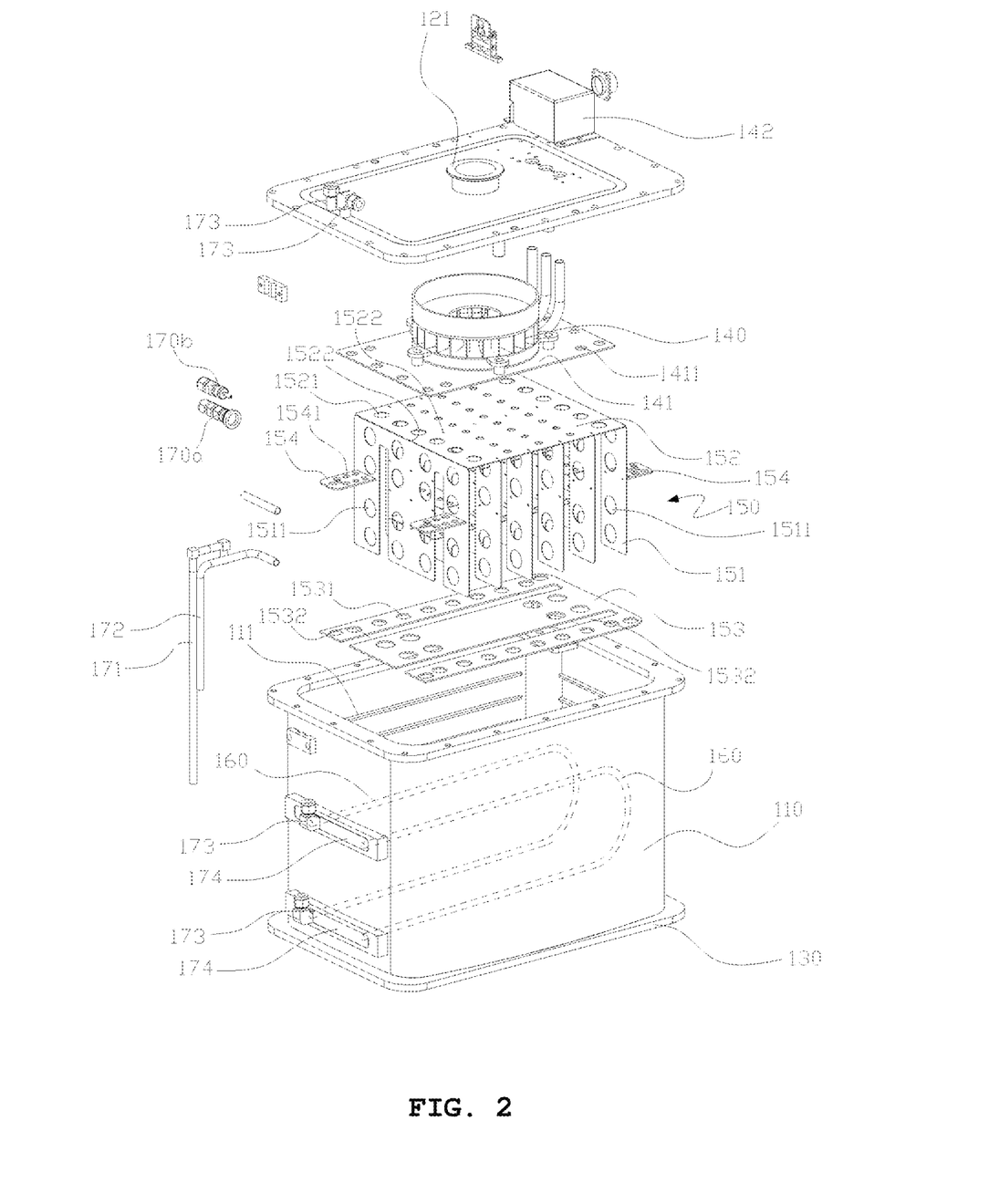
FIG. 2 is an exploded perspective view showing the apparatus for collecting a by-product according to one embodiment of the present invention.
Figure 3:
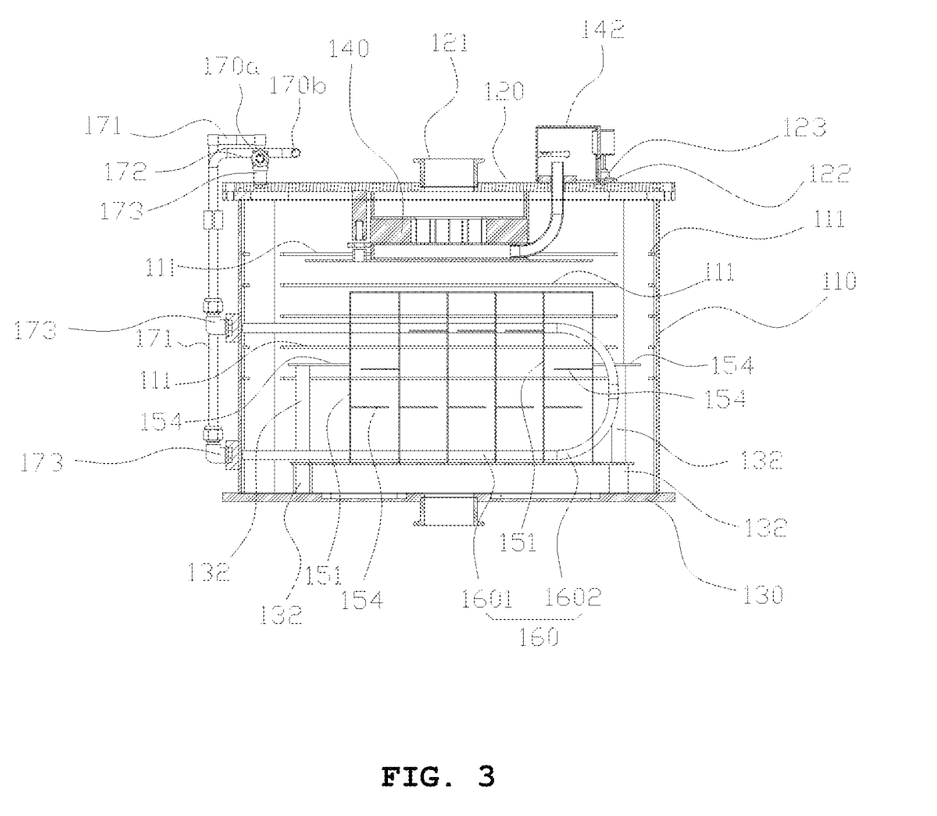
FIG. 3 is a front sectional view showing the apparatus for collecting a by-product according to one embodiment of the present invention.
Figure 4:
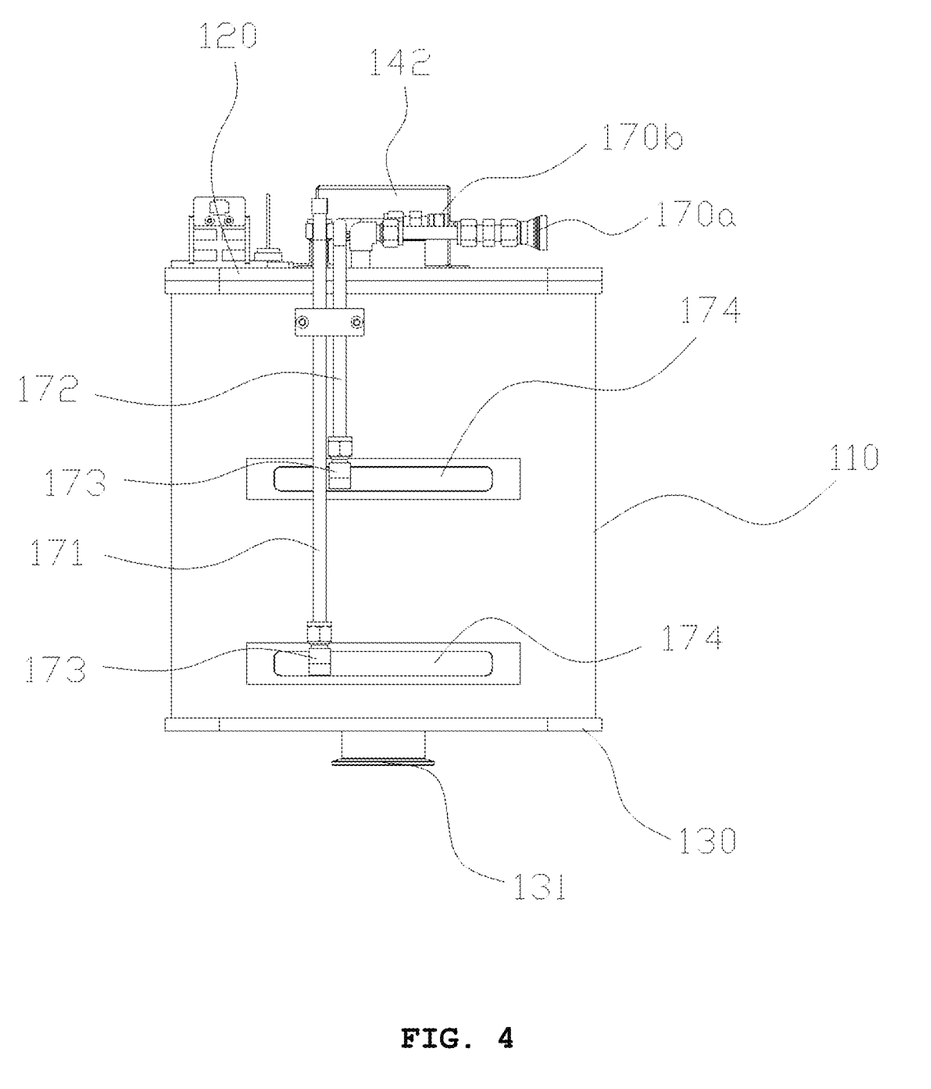
FIG. 4 is a side view showing the apparatus for collecting a by-product according to one embodiment of the present invention.
Figure 5:
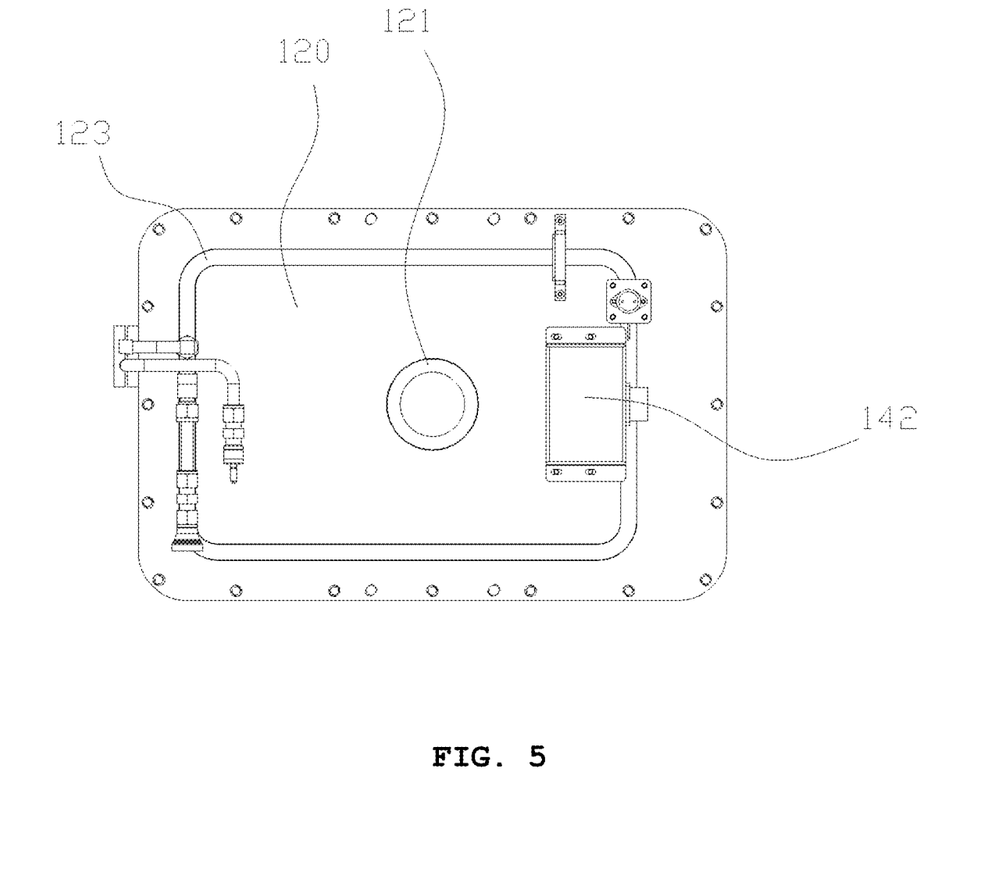
FIG. 5 is a plan view showing the apparatus for collecting a by-product according to one embodiment of the present invention.
Figure 6:
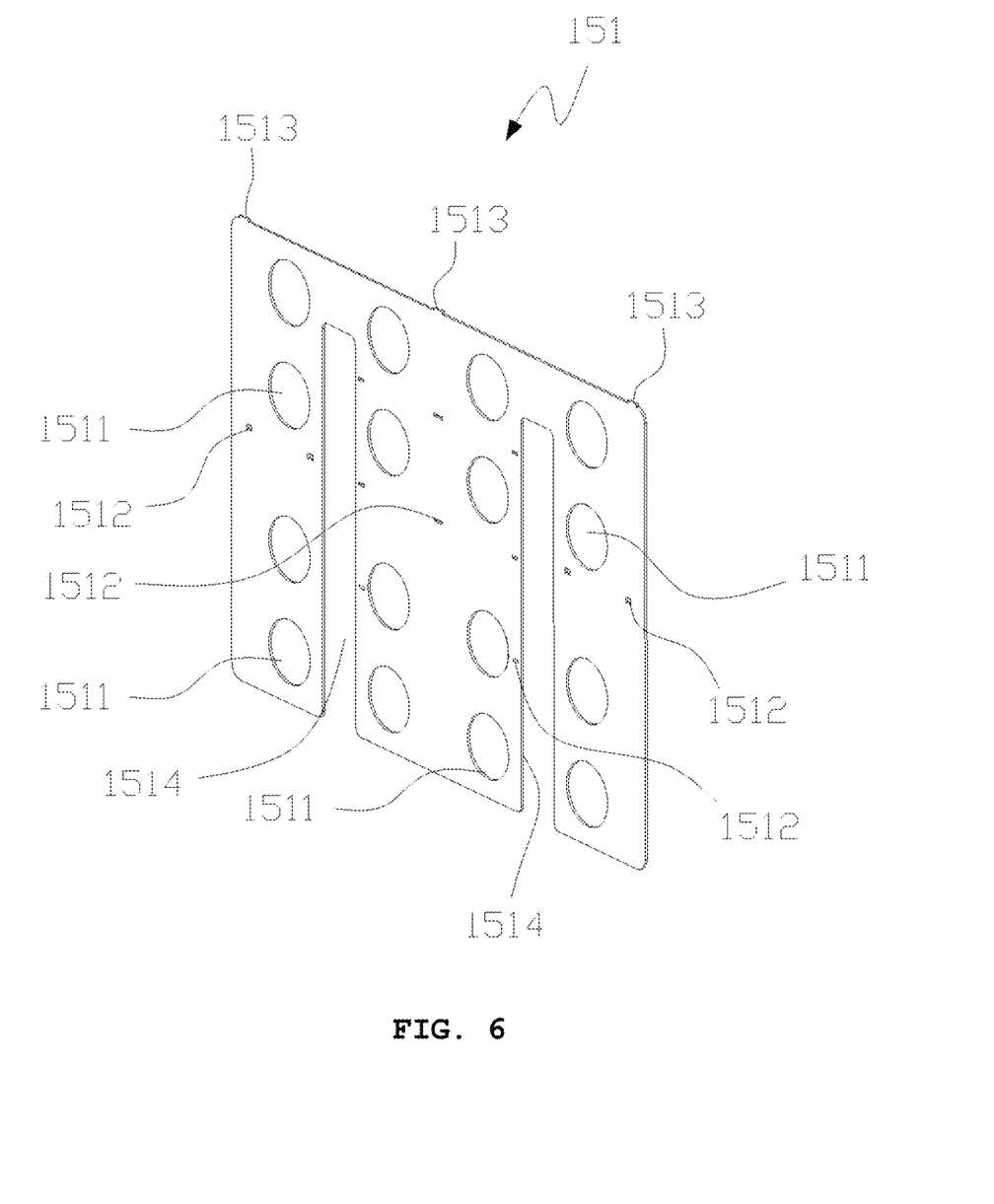
FIG. 6 is an exemplary view showing a vertical plate according to one embodiment of the present invention.
Figure 7:
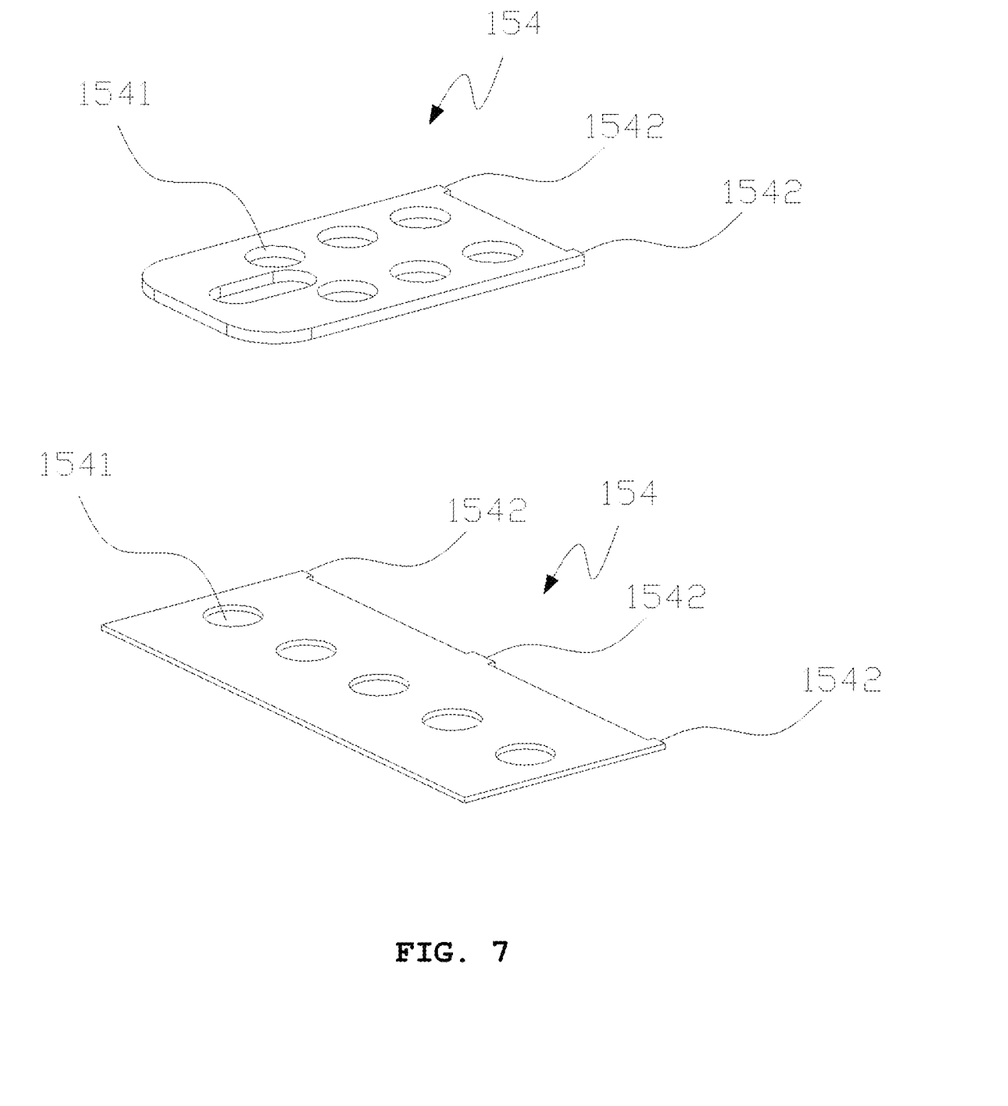
FIG. 7 is an exemplary view showing a type of vortex plate according to an embodiment of the present invention.
Figure 8:
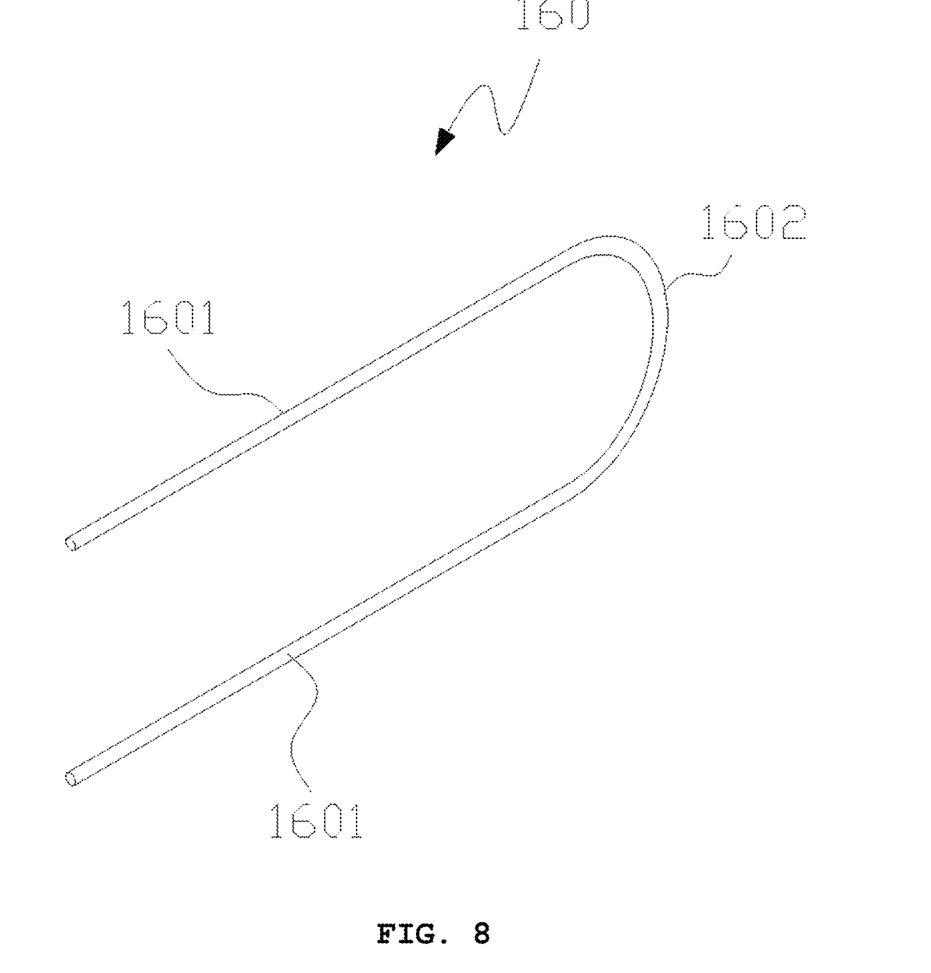
FIG. 8 is a perspective view showing a main cooling channel according to one embodiment of the present invention.

FIG. 1 is a perspective view showing an apparatus for collecting a by-product according to one embodiment of the present invention, FIG. 2 is an exploded perspective view showing the apparatus for collecting a by-product according to one embodiment of the present invention, FIG. 3 is a front sectional view showing the apparatus for collecting a by-product according to one embodiment of the present invention, FIG. 4 is a side view showing the apparatus for collecting a by-product according to one embodiment of the present invention, FIG. 5 is a plan view showing the apparatus for collecting a by-product according to one embodiment of the present invention, FIG. 6 is an exemplary view showing a vertical plate according to one embodiment of the present invention, FIG. 7 is an exemplary view showing a type of vortex plate according to an embodiment of the present invention, and FIG. 8 is a perspective view showing a main cooling channel according to one embodiment of the present invention.

An apparatus having a cooling line for collecting a by-product in a semiconductor manufacturing process according to the present invention is an apparatus whereby particulate toxic gases, which are contained in exhaust gas discharged from a process chamber, are condensed and collected as a by-product, and the exhaust gas is discharged to a vacuum pump during a semiconductor process. In particular, this is an apparatus whereby particulate toxic gases contained in exhaust gas components discharged after use out of a process chamber that performs TiN-ALD and CVD processes are uniformly condensed as a high-density by-product on an internal collecting tower and a wall of a housing.

The apparatus largely includes: a housing 110 in which introduced exhaust gas is received and then discharged, and having an inner wall plate 111 on an inner wall thereof to collect a by-product while generating a vortex in the introduced exhaust gas;

an upper plate 120 covering top of the housing 110, supplying the exhaust gas into the housing 110 through a gas inlet, and having an upper cooling channel for O-ring protection;

a lower plate 130 covering bottom of the housing 110, and discharging the exhaust gas from which the by-product is removed, through a gas outlet;

a heater 140 controlling the exhaust gas introduced into the housing 110 to have an appropriate temperature distribution capable of by-product formation and uniformly distributing the exhaust gas to surroundings;

an internal collecting tower 150 provided inside the housing 110 at a location spaced apart upward from the lower plate 130 by a predetermined distance, and including multiple vertical plates providing a main cooling channel installation space, an upper cover plate covering upper sides of the vertical plates to induce the flow of the exhaust gas, and vortex plates fitted to the vertical plates to generate a vortex in which the vertical plates, the upper cover plate, and the vortex plates are assembled together, the internal collecting tower condensing the introduced exhaust gas to collect a by-product;

a main cooling channel 160 cooling the exhaust gas by using coolant while passing through the internal collecting tower 150 and;

a multi-connection pipe 170 sequentially supplying the coolant to the upper plate cooling channel and the main cooling channel in a circulative manner and discharging the coolant, by using a supply pipe and a discharge pipe that are provided outside the housing 110.

In order to prevent corrosion caused by the exhaust gas discharged from the process chamber, most components of the apparatus for collecting a by-product according to the present invention are made of any one of stainless steel, aluminum, and other corrosion-resistant metals.

Hereinafter, each component of the apparatus for collecting a by-product will be described in detail.

The housing 110 having a hollow box shape serves to secure a gas channel space such that a by-product in exhaust gas introduced into the internal collecting tower 150 provided therein is condensed for collection.

The housing 110 has an open top and bottom. When the internal collecting tower 150 is accommodated therein, open top and bottom spaces of the housing 110 are covered with the upper plate and lower plates 120 and 130 and fixed using a fastening means such as a bolt.

Multiple inner wall plates 111 are provided on each side of the inner wall of the housing 110 at a regular interval over upper and lower regions to collect a by-product in introduced exhaust gas while generating a vortex.

At the inner wall plates 111, a retarded and irregular flow generated when exhaust gas collides with the inner wall plates 111 and a surrounding exhaust gas flow that does not collide with the inner wall plates 111 are mixed with each other, allowing a vortex to be generated.

Furthermore, the inner wall plates 111 on each side of the housing may be arranged alternately with the inner wall plates 111 on a neighboring side. This configuration may ensure that exhaust gas flowing on each side collides with the inner wall plates 111 at a different location from exhaust gas flowing on the neighboring side, and flows of the exhaust gases are not constant, allowing a vortex to be generated.

Furthermore, the inner wall plates 111 on each side of the housing 110 may be arranged alternately at upper and lower locations such that each of the inner wall plates 111 is shorter in length than the horizontal length of each side of the housing. This configuration may ensure that flow in a region where the inner wall plates 111 are provided and flow in a region where the inner wall plates 111 are not provided are not the same, allowing a vortex to be generated.

Due to the fact that the inner wall plates 111 are provided over the upper and lower regions of the inner wall of the housing 110, the flow of exhaust gas introduced to the inner wall of the housing 110 is retarded due to a vortex generated from the wall side, and thus the exhaust gas is cooled uniformly due to the outside air temperature transmitted through the inner wall plates 111, allowing a by-product to be condensed on the inner wall of the housing 110. In particular, more by-products are condensed on the inner wall plates 111 at high density due to edge effect.

The upper plate 120 serves as a cover to cover the open top of the housing 110. The upper plate 120 includes a gas inlet 121 protruding upward of a gas hole to allow introduction of exhaust gas, and fixed by welding or the like. The gas inlet 121 receives exhaust gas discharged from the process chamber and supplies the exhaust gas into the housing 110.

The upper plate 120 serves to prevent that an O-ring (not shown) for airtightness provided on a lower portion of the upper plate 120 is deformed and deteriorated in function when the temperature of an internal space of the housing 110 is controlled in response to the operation of the heater 140 provided on a lower side of the upper plate 120. The upper plate 120 includes an upper plate cooling channel 122 formed in the form of a groove in an upper side thereof. The upper plate cooling channel 122 cools down exhaust gas that is introduced into the lower portion of the upper plate 120 and heated to a high temperature by the heater 140 in order to appropriate temperature maintenance when a by-product is collected. An upper portion of the upper plate cooling channel 122 in the form of a groove is covered by a channel cover 123 in a water-tight manner. To this end, although not shown in the drawings, the channel cover 123 may be fastened by including a sealing treated portion for water-tightness, and a fastening method may be a known technique such as fitting, welding, bolting, and the like.

The upper plate cooling channel 122 is configured such that coolant supplied externally is introduced through a first branch socket 173 connected to a coolant inlet 170a of the multi-connection pipe 170 and circulates, and then the coolant is discharged to the multi-connection pipe 170 through a second branch socket 173 to be supplied to the main cooling channel 160. The upper plate cooling channel 122 is configured to have a boundary portion such that ends thereof do not communicate with each other and thus supplied coolant and discharged coolant are not mixed with each other. The coolant may be water or a refrigerant.

The lower plate 130 serves as a cover to cover the open bottom of the housing 110. The lower plate 130 includes a gas outlet 131 protruding downward of a gas hole of a predetermined point and fixed by welding or the like. The gas outlet 131 is a passage through which exhaust gas that results from condensing and removing a by-product is discharged.

Furthermore, the lower plate 130 includes multiple supporters 132 protruding upward in the housing 110 at multiple points such that the supporters 132 support the load of the internal collecting tower 150 while spacing the internal collecting tower 150 upward from the lower plate 130 by a predetermined distance. A part of the supporters 132 spaces a base plate located at the lowermost portion of the internal collecting tower 150 from the bottom of the housing 110 by a predetermined distance, and a remaining part of the supporters 132 supports vortex plates that protrude outward to cross each of opposite vertical plates provided at the outermost portions of the internal collecting tower 150.

The fastening between the supporters 132 and the internal collecting tower 150 may be realized by a simple fitting method, by using a fastening member such as a bolt, or by various other known fastening methods.

The heater 140 is mounted to the upper plate 120 by a fastening method such as bolting, welding, or the like so as to be close to a lower end of the gas inlet 121, such that exhaust gas introduced into the housing 110 is controlled to have an appropriate temperature distribution capable of by-product formation.

The heater 140 further includes a heat distribution plate 141 provided therebelow by a fastening means so as to be spaced apart downward by a predetermined distance. The heat distribution plate 141 transfers heat generated from the heater 140 to a far region in a lower space of the upper plate 120 while preventing the heat from being directly transferred to top of the internal collecting tower 150.

The heat distribution plate 141 includes multiple gas holes 1411 formed in end portions thereof. The heat distribution plate 141 is configured to be larger in size than the heater 140 and than the top area of the internal collecting tower 150 located below the heat distribution plate 141.

The heat distribution plate 141 configured as described above supplies a part of exhaust gas passing through the gas holes 1411 formed in the end portions thereof toward top of the internal collecting tower 150 located below the heat distribution plate 141, and the heat distribution plate 141 supplies a remaining part of exhaust gas toward the inner wall of the housing 110 located sideward of the heat distribution plate 141.

The fastening between the heat distribution plate 141 and the heater 140 may be realized by bolting. Other fastening methods may be known fastening methods, and thus a detailed description thereof will be omitted.

When the power is applied to the heater 140 from a heater power supply unit 142 having a temperature sensor and provided on an upper side of the upper plate 120, the heater 140 generates heat of a predetermined temperature.

The temperature of the heater 140 may be set differently for each type of exhaust gas. The heater 140 is made of a material such as ceramic or inconel to prevent corrosion caused by exhaust gas. A basic shape of the heater 140 is a configuration in which multiple radiating fins (or radiating plates) are arranged in a radial arrangement such that heat is radiated uniformly.

The heater 140 serves to allow exhaust gas discharged from the process chamber to be introduced through the gas inlet 121 of the upper plate 130 without causing the exhaust gas to be condensed and clog the gas inlet 121, and to allow maximum condensation to occur when the exhaust gas reaches the internal collecting tower 150.

The heater 140 configured as described above ensures that temperature-controlled exhaust gas is uniformly supplied to the internal space of the housing 110, allowing uniform condensation to occur.

Furthermore, another reason of provision of the heat distribution plate 141 is to prevent a case where when gas in which the amount of light gas in exhaust gas discharged from the process chamber is higher than the amount of heavy gas is supplied in accordance with a semiconductor manufacturing process change, exhaust gas present on a side far from the heater 140 is cooled faster than that on a side near to the heater 140 and thus a high-density by-product is condensed on a portion of an upper side far from the heater 140 and clogs a space channel before reaching the internal collecting tower 150 for collection, or a case where when the exhaust gas is cooled to a temperature lower than that of the aforementioned case, a low-density porous by-product is formed and clogs the space channel. To this end, the heat distribution plate 141 is located below the heater 140 as described above, thus ensuring that heat is conducted and transferred farther.

The internal collecting tower 150 is accommodated inside the housing 110. The internal collecting tower 150 condenses exhaust gas to collect a high-density byproduct, while increasing a contact channel with the exhaust gas and the time the exhaust gas stays.

The internal collecting tower 150 includes the multiple vertical plates 151 arranged spaced apart from each other at a regular interval, the upper cover plate 152 covering the upper sides of the vertical plates 151, and a base plate 153 supporting lower portions of the vertical plates 151, and the vortex plates 154 fitted to cross the vertical plates 151 in horizontal directions.

Gas holes 1511, 1521, 1531, and 1541 are respectively formed in the surfaces of each of the vertical plates 151, the upper cover plate 152, the base plate 153, and each of the vortex plates 154. The size of the gas hole 1511 of the vertical plate 151 is larger than the size of the gas holes 1521, 1531, and 1541 of the upper cover plate 152, the base plate 153, and the vortex plate 154 to facilitate movement of exhaust gas in a lateral direction. Herein, it is preferable that among the upper cover plate 152, the base plate 153, the vortex plates 154 that are provided in the horizontal directions, the gas hole 1531 of the base plate 153 located at the lowermost portion has the largest size such that the exhaust gas is efficiently discharged to the gas outlet 131.

In addition to the gas hole 1511, each of the vertical plates 151 includes fitting portions 1512 and fitting pieces 1513 that are coupled to the upper cover plate 152 and the vortex plates 154 in a fitted manner. The fitting portions 1512 are arranged at a regular interval along horizontal directions and vertical directions in which the vortex plates 154 are arranged, such that the vortex plates 154 are fitted to the fitting portions 1512 in horizontal directions. The fitting pieces 1513 are formed at an upper end of the vertical plate 151 to be fitted to the upper cover plate 152.

Furthermore, each of the vertical plates 151 includes at least one pipe slit 1514 formed vertically to allow the main cooling channel 160 to pass through the vertical plates 151 arranged at a regular interval. This ensures that the main cooling channel 160 having a U-shape is installed freely without interference while easily adjusting a vertical position thereof. The pipe slit 1514 is configured such that an upper end is closed and only a lower end has an opening.

The upper cover plate 152 includes multiple gas holes 1521 of different sizes formed in the surface thereof. A part of the gas holes that is located at opposite end portions in long side directions of the upper cover plate 152 is larger in size than a remaining part of the gas holes that is located at other locations, such that exhaust gas introduced from above the upper cover plate 152 is discharged more through the end portions thereof than central portions. Due to such a difference in the size of the gas holes 1521, a difference in flow rate occurs, allowing a vortex to be generated between exhaust gas flows in an internal space of the internal collecting tower 150.

In addition to the gas holes 1521, the upper cover plate includes multiple fitting portions 1522 such that the vertical plates 151 located therebelow are fitted thereto. A part of fitting portions 1522 that is located at the opposite end portions in the long side directions of the upper cover plate 152 have a groove shape, while a remaining part of the fitting portions 1522 has a hole shape, such that the fitting pieces 1513 formed at upper ends of the vertical plates 151 located below the upper cover plate 152 are fitted to the fitting portions 1522. Fitting joints therebetween may be additionally welded.

The base plate 153 includes multiple gas holes 1531 of different sizes for exhaust gas flow to allow exhaust gas to flow up and down. The base plate 153 serves to support load by supporting the lower portions of all of the vertical plates 151 in contact therewith. The base plate 153 is spaced apart from the bottom of the housing 110 by the supporters 132 provided at the lower plate 130, such that heat of exhaust gas is prevented from being directly transferred to the lower plate 130.

Furthermore, the base plate 153 serves to prevent a by-product from falling directly into the gas outlet 131.

In addition to the gas holes 1531, the base plate 153 includes at least one pipe slit 1532 to allow the main cooling channel 160 to pass through the internal space of the internal collecting tower 150. This ensures that a pipe located below the main cooling channel 160 is installed without interference. The pipe slit 1532 is configured such that an opening is formed only in one direction of the base plate 153.

In addition to the gas hole 1541 for movement of exhaust gas, each of the vortex plates 154 includes at least two fitting pieces 1542 fitted to predetermined fitting portions 1512 of each of the vertical plates 151. The vortex plate 151 is coupled horizontally to the vertical plate 151, allowing a vortex to be generated in the flow of exhaust gas moving up and down.

Herein, a part of the vortex plates 154 is arranged between each neighboring vertical plates 151. These vortex plates are alternately arranged at locations of different heights. Such an alternate arrangement ensures that exhaust gas flows rapidly downward toward a gap defined between each of the neighboring vertical plates 151 and each of the vortex plates 154 facing toward the vertical plate 151 and being not in contact therewith, and thus the exhaust gas flows in a zigzag manner through the gaps between the vertical plates 151 and the vortex plates 154 arranged up and down. This rapid flow of the exhaust gas contributes to generating vortices around ends of the vortex plates 154 in addition to vortices generated by the vortex plates 154.

Depending on the types of the vortex plates, each of the vortex plates 154 may include two or three fitting pieces 1542 protruding from one side thereof to be fitted at two or three points of the fitting portions 152 of each of the vertical plates 151 such that a stable coupling state is maintained. The number of the fitting pieces 1542 may be variously embodied depending on the size or shape of the vortex plates 154.

Among the vertical plates 151, the upper cover plate 152, the base plate 153, and the vortex plates 154 constituting the internal collecting tower 150 described above, the gas hole 1511 of each of the vertical plates 151 is larger in size than the gas hole 1541 of each of the vortex plates 154, such that introduction of exhaust gas is performed more efficiently.

On the contrary, the gas hole 1541 of each of the vortex plates 154 is smaller in size than the gas hole 1511 of each of the vertical plates 151. This ensures that introduction of exhaust gas in the vertical direction is relatively reduced and the flow thereof is retarded, allowing a vortex to be generated to spread uniformly the exhaust gas inside the internal collecting tower 150.

When the exhaust gas is spread uniformly as described above, the exhaust gas cooled by the main cooling channel 160 comes into contact therewith while the exhaust gas introduced into the internal collecting tower 150 generates a vortex, and edge effect due to protruding structures occurs. This allows condensation of the exhaust gas to be increased, resulting in an increase in collection efficiency.

The main cooling channel 160 has a lateral U-shaped pipe shape. In detail, the main cooling channel 160 includes horizontal pipes 1601 located at upper and lower locations, and a curved pipe 1602 connecting the horizontal pipes 1601 to each other at a side of the main cooling channel 160. A single or multiple main cooling channels 160 may be provided.

The horizontal pipes 1601 pass through upper and lower portions of the internal collecting tower 150 to cool exhaust gas around upper and lower regions.

Coolant is supplied to the main cooling channel 160 through one of the horizontal pipes 1601 that is located at a lower location and then discharged to the external multi-connection pipe 170 through a remaining one of the horizontal pipes 1601 that is located at an upper location.

Herein, the temperature of the coolant flowing through the main cooling channel 160 may be controlled depending on the type of introduced exhaust gas. Thus, the present invention does not limit a specific coolant temperature.

In one embodiment of the present invention, two main cooling channels 160 are provided to increase cooling efficiency. Two or more main cooling channels 160 may be provided. Such a configuration ensures that exhaust gas flowing through the internal collecting tower 150 is cooled in a much shorter time. This therefore results in a by-product being condensed at high density on the surfaces of the vertical plates 151, the upper cover plate 152, the base plate 153, and the vortex plates 154 constituting the internal collecting tower 150.

The main cooling channels 160 configured as described above not only serve to allow a by-product contained in exhaust gas to be condensed on the surface of the internal collecting tower 150 by uniformly cooling the internal collecting tower 150, but also serve to allow the by-product to be collected on the surfaces of the main cooling channels while being in contact with the exhaust gas, whereby the overall collection efficiency is increased.

The multi-connection pipe 170 includes a coolant supply pipe 171 and a coolant discharge pipe 172 that are connected to respective branch sockets 173 provided at a location in which coolant is supplied to the upper plate cooling channel 122 and the main cooling channels 160 and a location in which the coolant is discharged, such that the coolant is circulated.

Introduced coolant is configured to circulate in connection with outside rather than in a closed circuit, such that coolant as a new heat source is supplied continuously instead of heat-exchanged coolant. To this end, a coolant source, a coolant supply pump, and a coolant storage tank, which are not shown, may be provided. A heat exchanger may be further provided as necessary.

In detail, in the multi-connection pipe 170, coolant is introduced through the first branch socket 173 of the upper plate cooling channel connected to the coolant inlet 170a and circulates. Then, the coolant is discharged to the supply pipe 171 of the multi-connection pipe 170 through the second branch socket 173 and is supplied to the main cooling channels 160 through a branch socket 173 located below the supply pipe 171. The coolant introduced into lower horizontal pipes 1601 of the main cooling channels 160 is moved to upper horizontal pipes 1601 to cool exhaust gas around the internal collecting tower 150 and then is discharged to the discharge pipe 172. Then, the coolant is discharged externally or to a coolant tank (not shown) through a coolant outlet 170b located at an end of the discharge pipe 172.

Meanwhile, when two or more main cooling channels 160 are provided, the multi-connection pipe 170 includes a coolant chamber 174 located at each of lower and upper locations in which the supply pipe 171 and the discharge pipe 173 are located, each of the respective coolant chambers having an internal space. This ensures that one supply pipe 171 simultaneously supplies coolant collected in the internal space of the coolant chamber 174 located at the lower location to two or more supply pipes located at lower locations without requiring respective connections between the coolant chambers 174 and the horizontal pipes, or that heat-exchanged coolant discharged to the internal space of the coolant chamber 174 located at the upper location is discharged through one discharge pipe 172.

Due to such provision of the coolant chambers 174, it is ensured that coolant is supplied simultaneously to each of the main cooling channels 160 without requiring provision of complicated pipes or branch sockets according to the number of the main cooling channels 160, and then coolant resulting from heat exchange through the internal collecting tower 150 is discharged simultaneously through outlets of the main cooling channels 160.

Figure 9:
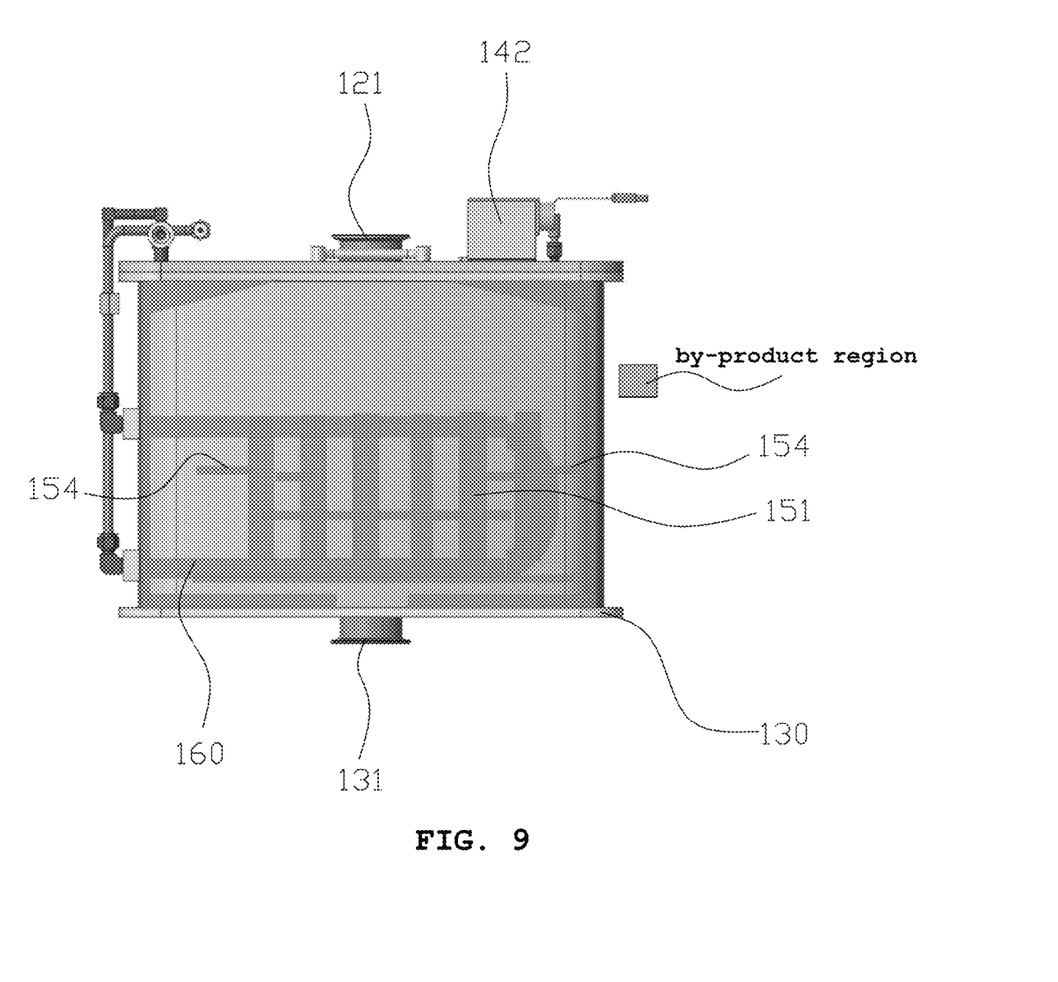
FIG. 9 is an exemplary view showing a by-product collection tendency in each region of the apparatus for collecting a by-product according to one embodiment of the present invention.

FIG. 9 is an exemplary view showing a by-product collection tendency in each region of the apparatus for collecting a by-product according to one embodiment of the present invention.

As shown in the figure, it can be ascertained that from exhaust gas introduced into the apparatus for collecting a by-product according to the present invention, high-density by-products are distributed and collected uniformly on lower outside portions of the upper plate on the inner wall of the housing, the internal collecting tower, and the main cooling channel.

Although the exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An apparatus having a cooling line for collecting a by-product in a semiconductor manufacturing process, the apparatus being provided on a line between a process chamber and a vacuum pump to collect a by-product in exhaust gas, which is discharged from the process chamber, the apparatus comprising:
   a housing (110) in which the exhaust gas introduced through an upper plate having a gas inlet and an upper plate cooling channel is accommodated and then the exhaust gas is discharged through a lower plate having a gas outlet, and including an inner wall plate (111) on an inner wall thereof to collect the by-product while generating a vortex in the exhaust gas which is temperature-controlled by a heater (140) while being introduced through the gas inlet of the upper plate;
   an internal collecting tower (150) provided inside the housing at a location spaced apart upward from the lower plate by a predetermined distance, and including multiple vertical plates providing a main cooling channel installation space, an upper cover plate covering upper sides of the vertical plates to induce flow of the exhaust gas, and vortex plates fitted to the vertical plates to generate a vortex in which the vertical plates, the upper cover plate, and the vortex plates are assembled together, the internal collecting tower condensing the introduced exhaust gas to collect the by-product;
   a main cooling channel (160) cooling the exhaust gas by using coolant while passing through the internal collecting tower (150); and
   a multi-connection pipe (170) sequentially supplying the coolant to the upper plate cooling channel and the main cooling channel in a circulative manner and discharging the coolant, by using a supply pipe and a discharge pipe that are provided outside the housing; wherein the inner wall plate is provided as multiple inner wall plates (111) that are arranged on each side of the inner wall of the housing (110) at a regular interval over upper and lower regions, the inner wall plates (111) on each side of the housing are arranged alternately with the inner wall plates on a neighboring side, and the inner wall plates on each side of the housing are arranged alternately at upper and lower locations such that each of the inner wall plates is shorter in length than a horizontal length of each side of the housing; wherein the internal collecting tower (150) includes the multiple vertical plates (151) arranged spaced apart from each other at a regular interval, the upper cover plate (152) covering the upper sides of the vertical plates (151), and a base plate (153) supporting lower portions of the vertical plates (151), and the vortex plates (154) fitted to cross the vertical plates in horizontal directions, wherein gas holes (1511, 1521, 1531, and 1541) are respectively formed in surfaces of each of the vertical plates (151), the upper cover plate (152), the base plate (153), and each of the vortex plates (154), and each of the vertical plates includes at least one pipe slit (1514) formed vertically to allow the main cooling channel to pass through the vertical plates, such that the main cooling channel having a U-shaped pipe shape is installed while easily adjusting a vertical position thereof; wherein the upper cover plate (152) includes multiple gas holes (1521) of different sizes formed in a surface thereof, wherein a part of the gas holes that is located at opposite end portions in long side directions of the upper cover plate is larger in size than a remaining part of the gas holes that is located at other locations, such that the exhaust gas introduced from above the upper cover plate is more discharged through the end portions thereof than central portions; wherein the gas hole (1511) of each of the vertical plates (151) is larger in size than the gas hole (1541) of each of the vortex plates (154); wherein in the multi-connection pipe (170), the coolant is introduced through a first branch socket (173) of the upper plate cooling channel connected to a coolant inlet (170a) and circulates, the coolant is discharged to the supply pipe (171) through a second branch socket (173) and supplied to the main cooling channel (160) through a branch socket (173) located below the supply pipe, the coolant introduced into lower horizontal pipes (1601) of the main cooling channels (160) is moved to upper horizontal pipes to cool the exhaust gas around the internal collecting tower and is discharged to the discharge pipe (172), and the coolant is discharged through a coolant outlet (170b) located at an end of the discharge pipe; wherein when two or more main cooling channels (160) are provided, the multi-connection pipe (170) includes a coolant chamber (174) located at each of lower and upper locations in which the supply pipe and the discharge pipe are located, each of the respective coolant chambers having an internal space, such that one supply pipe simultaneously supplies the coolant collected in the internal space of the coolant chamber (174) located at the lower location to two or more supply pipes located at lower locations, or heat-exchanged coolant discharged to the internal space of the coolant chamber (174) located at the upper location is discharged through one discharge pipe.

2. The apparatus of claim 1, wherein the upper plate cooling channel (122) of the upper plate is configured such that the coolant supplied externally is introduced through a first branch socket (173) connected to a coolant inlet (170a) of the multi-connection pipe (170) and circulates, and then the coolant is discharged to the multi-connection pipe through a second branch socket (173) to be supplied to the main cooling channel (160).

3. The apparatus of claim 1, wherein a part of the vortex plates is provided at each of opposite vertical plates of the internal collecting tower (150) so as to protrude outward, such that the flow of the exhaust gas is retarded while generating the vortex.

4. The apparatus of claim 1, wherein the main cooling channel (160) has a U-shaped pipe shape, with horizontal pipes (1601) located at upper and lower locations, and a curved pipe (1602) connecting the horizontal pipes to each other at a side of the main cooling channel.

5. The apparatus of claim 1, wherein the main cooling channel (160) is provided as two or more main cooling channels.

6. The apparatus of claim 1, wherein the heater (140) further includes a heat distribution plate (141) provided at a lower portion thereof by a fastening means so as to be spaced apart downward by a predetermined distance, the heat distribution plate having multiple gas holes (1411) formed in end portions thereof such that a part of the exhaust gas is supplied toward top of the internal collecting tower located below the heat distribution plate, and a remaining part of the exhaust gas is supplied toward the inner wall of the housing located sideward of the heat distribution plate.

* * * * *